United States Patent [19]
Adams

[11] Patent Number: 6,059,507
[45] Date of Patent: May 9, 2000

[54] SUBSTRATE PROCESSING APPARATUS WITH SMALL BATCH LOAD LOCK

[75] Inventor: Douglas R. Adams, Pepperell, Mass.

[73] Assignee: Brooks Automation, Inc., Chelmsford, Mass.

[21] Appl. No.: 09/049,314

[22] Filed: Mar. 27, 1998

Related U.S. Application Data

[60] Provisional application No. 60/044,490, Apr. 21, 1997.

[51] Int. Cl.⁷ ........................................................ B65G 1/10
[52] U.S. Cl. ........................ 414/217.1; 414/437; 414/439; 414/331.18
[58] Field of Search ..................................... 414/217, 416, 414/331.14, 331.15, 331.16, 331.17, 331.18, 937, 939, 940, 805, 811, 217.1; 204/298.25, 298.35; 118/719; 156/345

[56] References Cited

U.S. PATENT DOCUMENTS

| | | | |
|---|---|---|---|
| 3,756,435 | 9/1973 | Stergerwald | 414/217 |
| 4,150,759 | 4/1979 | Bell, Jr. | 414/217 X |
| 4,266,111 | 5/1981 | Trillwood | 414/217 X |
| 5,013,385 | 5/1991 | Maher et al. | 156/345 |
| 5,024,747 | 6/1991 | Turner et al. | 414/217 X |
| 5,156,521 | 10/1992 | Crabb et al. | 414/217 X |
| 5,512,320 | 4/1996 | Turner et al. | 427/255 |
| 5,553,396 | 9/1996 | Kato et al. | 414/939 X |
| 5,562,383 | 10/1996 | Iwai et al. | 414/939 X |
| 5,586,585 | 12/1996 | Bonora et al. | 414/940 X |
| 5,607,276 | 3/1997 | Muka et al. | 414/331 |
| 5,740,034 | 4/1998 | Saeki | 414/937 X |
| 5,788,458 | 8/1998 | Bonora et al. | 414/940 X |
| 5,855,681 | 1/1999 | Maydan et al. | 118/719 |
| 5,909,994 | 6/1999 | Blum et al. | 414/939 X |

FOREIGN PATENT DOCUMENTS

| | | | |
|---|---|---|---|
| 6-104326 | 4/1994 | Japan | 414/939 |
| 6-314729 | 11/1994 | Japan | 414/939 |
| WO94/23911 | 10/1994 | WIPO . | |

*Primary Examiner*—Gregory A. Morse
*Attorney, Agent, or Firm*—Perman & Green, LLP

[57] ABSTRACT

A substrate load lock comprising a frame and a substrate support movably mounted to the frame. The frame forms at least three chambers. The substrate support has at least two separate support areas. The first one of the support areas is movable between the first one of the chambers. A second one of the support areas is movable between the second chamber and a third one of the chambers.

31 Claims, 4 Drawing Sheets

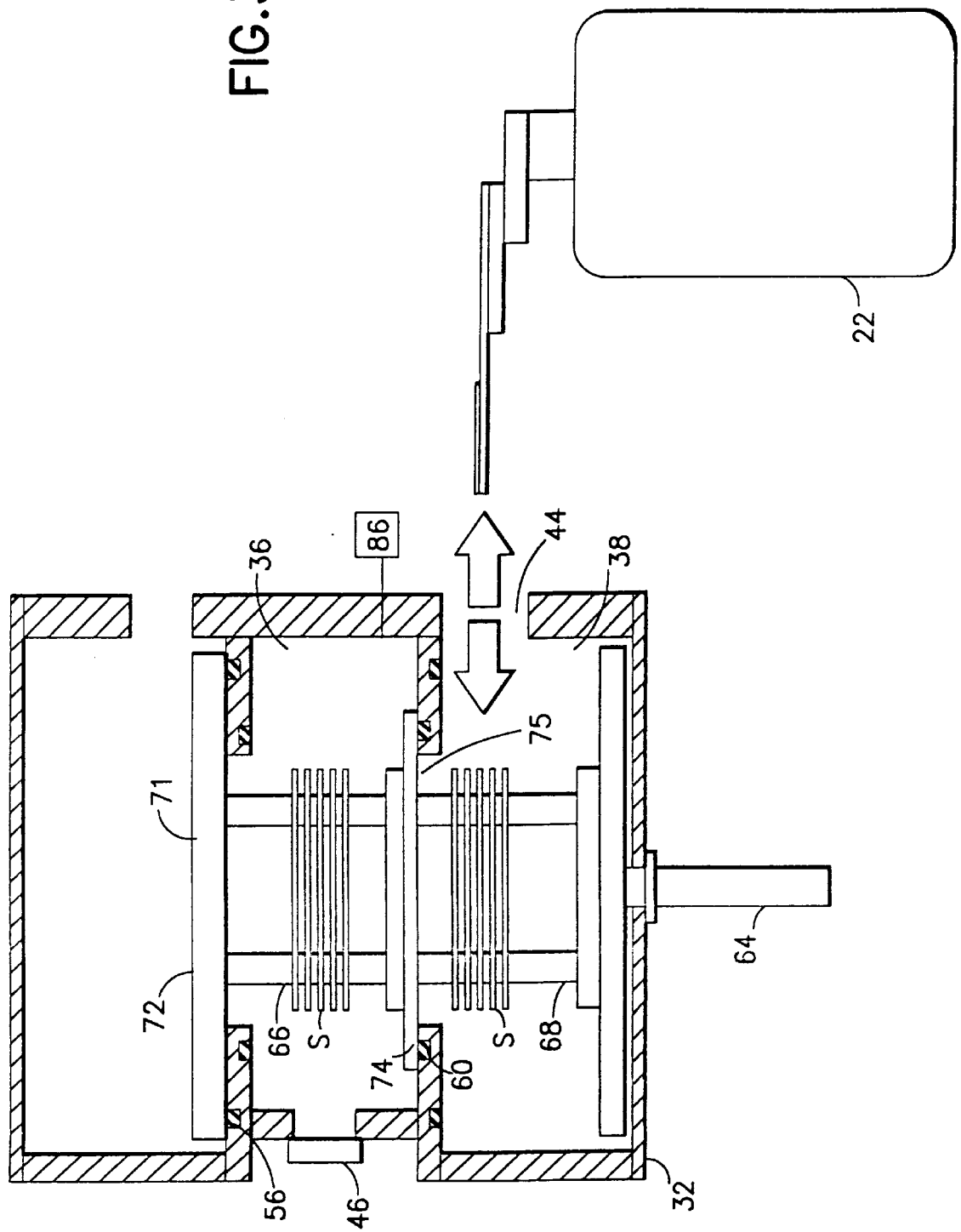

SUBSTRATE PROCESSING APPARATUS WITH SMALL BATCH LOAD LOCK

CROSS-REFERENCE TO RELATED APPLICATION

This application claims the benefit of U.S. Provisional Application No. 60/044,490, filed Apr. 21, 1997.

BACKGROUND OF THE INVENTION

1. Field of the Invention

The present invention relates to substrate processing apparatus and, more particularly, to load lock adapted to hold more than one set of substrates.

2. Prior Art

U.S. Pat. No. 5,013,385 discloses a substrate processing apparatus. Load locks between substrate cassettes in atmospheric pressure and a vacuum chamber of a substrate processing apparatus are also know in the art.

SUMMARY OF THE INVENTION

In accordance with a first embodiment of the present invention, a substrate load lock is provided. The substrate load lock comprises a frame and a substrate support movably mounted to the frame. The frame forms at least three chambers. The substrate support has at least two separate support areas. A first one of the support areas is movable between a first one of the chambers and a second one of the chambers. The second one of the support areas is movable between the second chamber and a third one of the chambers.

In accordance with a second embodiment of the present invention, a substrate load lock is provided. The substrate load lock comprises a frame forming at least one sealable chamber, means for varying the environment of the chamber and at least two substrate supports. The substrate supports are movably connected to the frame. Each substrate support is alternately movable into the sealable chamber. When the sealable chamber is sealed, only one of the substrate supports is located therein.

In accordance with a third embodiment of the present invention, a substrate load lock is provided. The substrate load lock comprises a frame and a movable support attached to the frame. The frame has a chamber formed therein. The chamber has an upper substrate receiving opening and a lower substrate receiving opening. The movable support has an upper substrate support area and a lower substrate support area. The movable support reciprocates to alternately move the upper support area and the lower support area into the chamber. The upper support area is moved into the chamber through the upper substrate receiving opening. The lower support area is moved into the chamber through the lower substrate receiving opening.

In accordance with a method of the present invention, a method for transporting a substrate between a substrate processing device and a supply module is provided. The method comprises the steps of transporting the substrate between a movable first substrate support area in a load lock and a supply module, moving the first substrate support area within the load lock and transporting the substrate between the first substrate support area in the load lock and the substrate processing device. The first substrate support area is located in an initial position wherein a first substrate mechanism for transporting substrates between the supply module and load lock has access to the first substrate support area. The first substrate support area is moved from the initial position to a final position within the load lock. In the final position, a second substrate transport mechanism has access to the first substrate support area. The second substrate support mechanism transports the substrate between the first substrate support area in the load and the substrate processing device.

BRIEF DESCRIPTION OF THE DRAWINGS

The foregoing aspects and other features of the present invention are explained in the following description, taken in connection with the accompanying drawings, wherein:

FIG. 3A is a schematic cross-sectional side view of the load lock shown in FIG. 2 with its substrate support at a down position.

DETAILED DESCRIPTION OF THE PREFERRED EMBODIMENT

Figure 1:
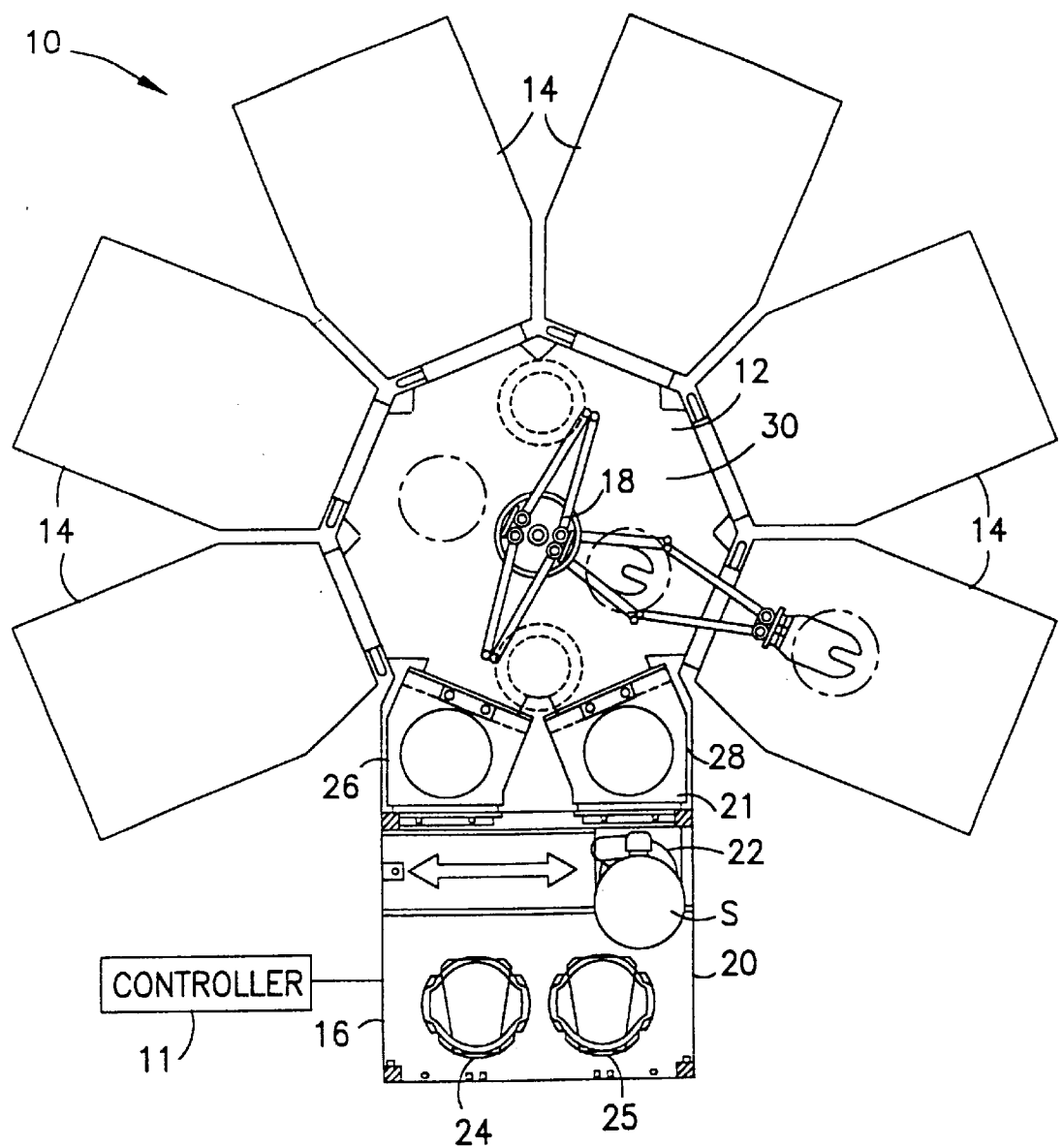
FIG. 1 is a schematic top plan view of a substrate processing apparatus comprising features of the present invention.

Referring to FIG. 1, there is shown a schematic top plan view of a substrate processing apparatus 10 incorporating features of the present invention. Although the present invention will be described with reference to the single embodiment shown in the drawings, it should be understood that the present invention can be embodied in many alternate forms of embodiments. In addition, any suitable size, shape or type of elements or materials could be used.

Figure 2:
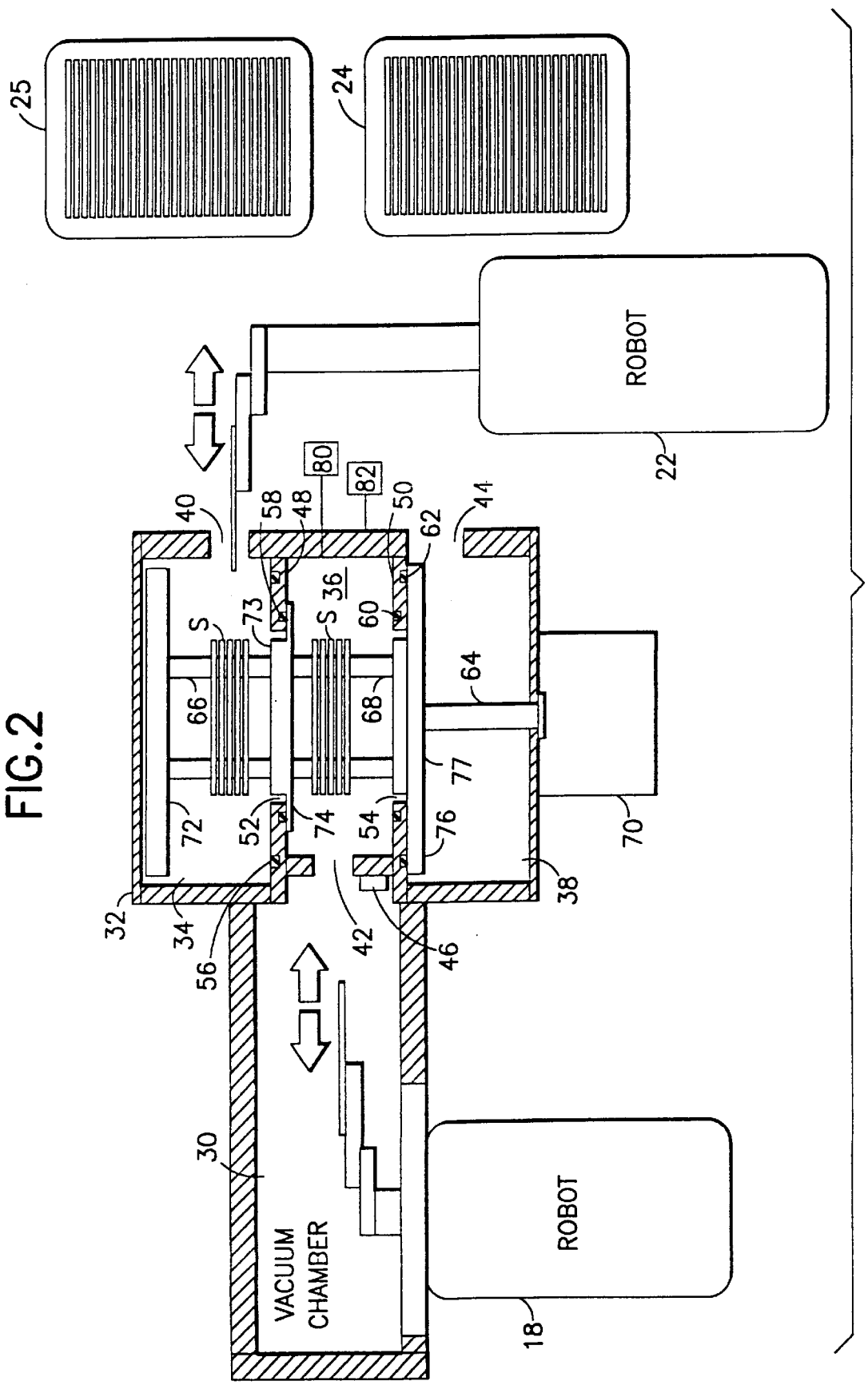
FIG. 2 is a schematic cross-sectional side view of the apparatus shown in FIG. 1.

The apparatus 10 includes a main section 12, substrate processing modules 14 and a substrate supply module 16. The main section 12 has a substrate transport 18 for moving substrates among the modules 14, 16. The substrate transport 18 is substantially the same as the transfer device described in PCT patent publication No. WO 94/23911 which is hereby incorporated by reference in its entirety. However, any suitable type of transport could be used. The chamber 30 formed by the main section 12 is preferably maintained in a vacuum. In alternate embodiments, the chamber formed by the main section may contain inert gases to enhance gas assisted processing. The substrate supply module 16 is connected to a front end 21 of the main section 12. Referring also to FIG. 2, the substrate supply module 16 is located outside the vacuum chamber 30. The substrate supply module 16 is open to the atmosphere. The supply module 16 has a frame 20, a substrate transport 22, and means for holding two substrate cassettes 24, 25. However, in alternate embodiments, any suitable type of substrate supply module could be provided. The substrate processing modules 14 are well known in the art and, therefore, will not be described further. The substrates S could be semiconductor wafers, flat panel display substrates, or any other type of substrate.

In the preferred embodiment, the front end 21 of the main section has two load locks 26, 28. In alternate embodiments the main section may have more or fewer load locks. In still other embodiments, the load locks may be located individually or in number at various different locations around the perimeter of the main section. The load locks 26, 28 function as an isolation compartment. The load locks 26, 28 allow transport of substrates between the vacuum chamber 30 and the supply module 16; namely, between a vacuum environment and an atmospheric pressure environment. The atmospheric robot 22 transports the substrates from the cassettes 24, 25 to the load locks 26, 28 of the main section 12. The load locks 26, 28 are cycled so that the substrates therein may be transported into the vacuum chamber 30 without loss of vacuum. After the load locks 26, 28 are cycled, the vacuum chamber robot 18 transports the substrates from the load locks 26, 28 to the processing modules 14. When the substrates are finished being processed, the substrates are returned to the load locks. The vacuum chamber robot 18 transports the substrates from the modules 14 to the load locks 26, 28. The load locks 26, 28 are then cycled to restore the substrates therein to atmospheric conditions. Finally, the atmospheric robot 22 transports the substrates from the load locks 26, 28 back to the cassettes 24, 25.

A problem was encountered with prior art systems in that the loading and unloading of batches of substrates by the atmospheric robot at a batch load lock, and the subsequent evacuation or pressurizing of the load lock, took too long. This meant that the vacuum chamber robot could not operate at a 100% duty cycle or, the atmospheric robot had to be operated so fast that the wafer handling problems occurred. The atmospheric robot did not work at a 100% duty cycle because it had to wait for the load lock to be pressurized. The process for transporting substrates between the supply module and main section was a linear or sequential process when using the load locks of the prior art. The transport process substantially comprised four basic steps performed in linear succession, the sequence of steps being repeated until the transport of substrates was completed. For example, to load the substrates from the supply module into the main section, first, the atmospheric robot transported the substrates from the supply module into the load lock. Second, the environment inside the load locks was cycled to provide a vacuum condition therein. Third, after the environment in the load lock was cycled to vacuum, the vacuum chamber robot transported the substrates from the load lock to the main section. Fourth, after being filled with substrates from the robot 18, the environment of the load lock was cycled back to atmosphere before the atmospheric robot could unload the substrates from the load lock and commence the first step of the next transport sequence again. Both the atmospheric robot and the vacuum chamber robot could need to be idle during the time that the environment of the load lock was cycled between vacuum and atmosphere. Furthermore, the atmospheric robot could remain idle when the load lock was open to the vacuum chamber and the vacuum chamber robot transported substrates between load lock and main section. Conversely, the vacuum chamber robot could be idle when the load lock was open to atmosphere and transport operations between supply module and load lock were in progress. Therefore, the atmospheric robot and vacuum robot could be idle about 75% of the time under this process of the prior art. Introduction in the prior art of an additional separate load lock increased the efficiency of the substrate transport operation, but the atmospheric robot and vacuum chamber robot remained idle about 50% of the time. To reduce the idle time of the vacuum chamber robot, the atmospheric robot had to operate at maximum speed when loading and unloading substrates. Nevertheless, the atmospheric robot remained idle waiting for access to the load lock. This type of hurry-up and wait operation slowed down the operation of the apparatus.

Referring still to FIG. 2, the load lock of the present invention overcomes the problem in the prior art by using a multi-chamber load lock. The two load locks 26, 28 are substantially the same, but have frames configured as left side and right side units. Thus, the invention will be described with reference to the load lock 26 only. The same description also applies to the load lock 28. Alternatively, the load lock 28 could be a different type of load lock. The load lock 26 has a frame 32 connected to the frame of the main section 12. The frame 32 has three chambers 34, 36, 38. In the preferred embodiment the chambers 34, 36, 38 are vertically offset. In alternate embodiments, the load lock may have the three chambers offset in any other suitable manner, such as a horizontal offset. The upper chamber 34 has a front aperture 40. The middle chamber 36 has a rear aperture 42. The bottom chamber 38 has a front aperture 44. The front aperture 40 of the upper chamber 34 and the front aperture 44 of the bottom chamber 38 are open to the ambient atmosphere. However, doors could be provided. The front apertures 40, 44 are adapted to allow the atmospheric robot 22 access into the upper chamber 34 and bottom chamber 38 respectively to transport substrates between the load lock 26 and the supply module 20. The rear aperture 42 of the middle chamber 36 opens into the vacuum chamber 30. The rear aperture 42 is adapted to allow the vacuum chamber robot 18 access into the middle chamber 36 to transport substrates between the load lock 26 and the main section 12. A movable door 46 is provided to close the rear aperture 42. The two front apertures 40, 44 do not need doors. The frame 32 has two dividers 48, 50 that help to define the three chambers 34, 36, 38. The two dividers 48, 50 have passageway apertures 52, 54 and seals 56, 58, 60, 62. For the upper divider 48, the upper surface seal 56 is larger than the lower surface seal 58. For the lower divider 50, the upper surface seal 60 is smaller than the lower surface seal 62. The load lock 26 also has a movable substrate support 64. The support 64 has two support sections 66, 68. Each support section 66, 68 can hold a plurality of the substrates S. Thus, the support 64 is able to hold two separate sets of substrates. The movable support 64 extends substantially vertically within the frame 32 of the load lock 26. The movable support 64 spans through the middle chamber 36 within the passageway apertures 52, 54. The two support sections 66, 68 are vertically offset. The movable support 64 is movably mounted to the frame 32 of the load lock 26. The support 64 is moved in a generally vertical direction by a vertical drive motor 70 such as a hydraulically or pneumatically powered piston or other suitable linear actuator. In the preferred embodiment, the drive motor 70 is mounted to the frame 32 of the load lock. In alternate embodiments, the drive for the movable support may be mounted to any other suitable part of the processing apparatus 10. The drive motor 70 vertically moves the support 64 up and down, generally like a poppet, relative to the frame 32 of the load lock 26.

Figure 3B:
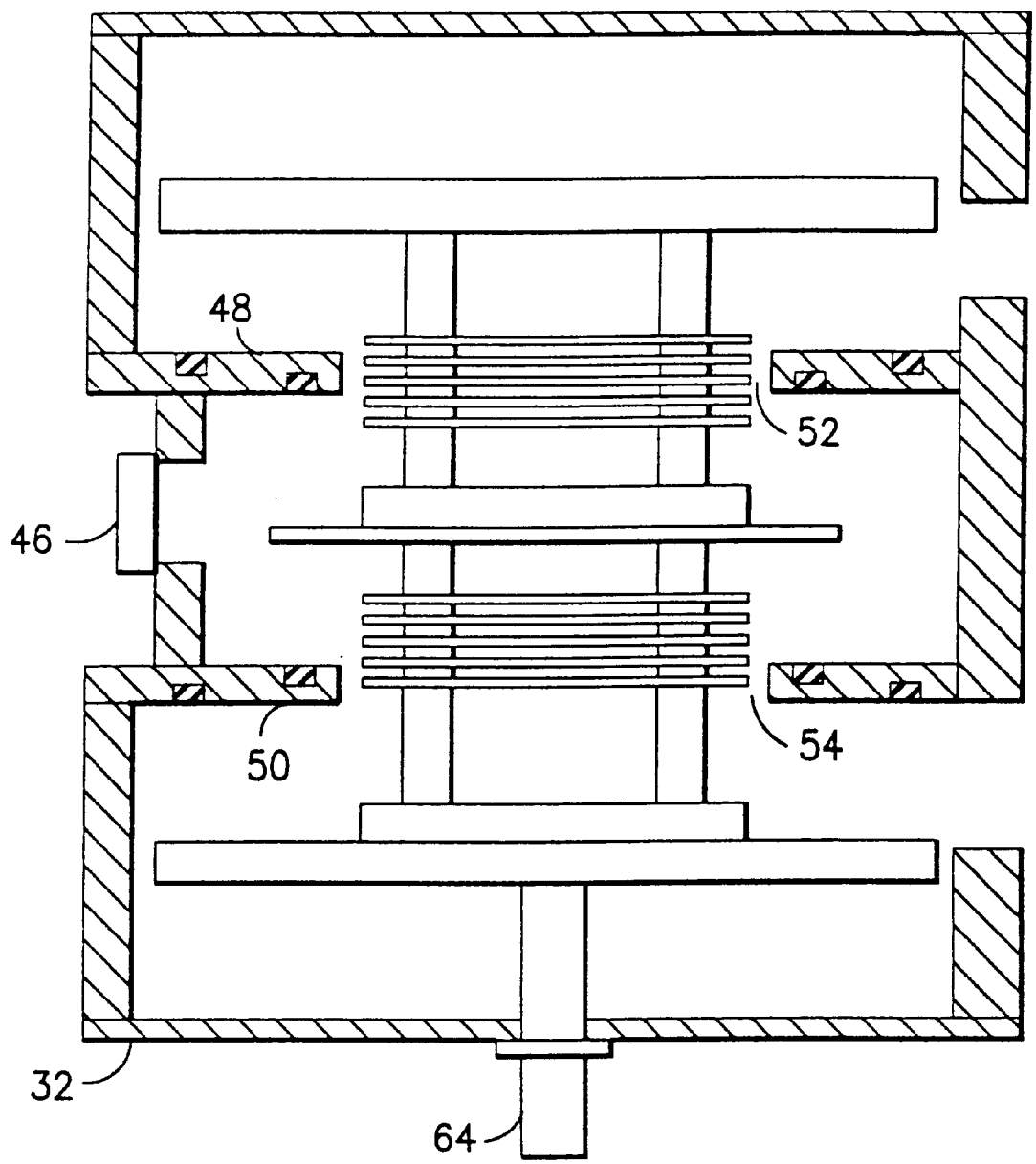
FIG. 3B is a schematic cross-sectional side view of the load lock shown in FIG. 3A with its substrate support at an intermediate position.

Referring now to FIGS. 2 and 3A, FIG. 2 shows the movable support 64 in the up position and FIG. 3A shows the movable support 64 in the down position. The support sections 66, 68 are located on the movable support 64 so that when the support 64 is in the down position the upper support section 66 is in the middle chamber 36 and the lower support section 68 is in the bottom chamber 38 (see FIG. 3A). When the movable support 64 is in the up position, the upper support section 66 is in the upper chamber 34 and the lower support section 68 is in the middle chamber 36. In the preferred embodiment, each support section 66, 68 supports the substrates loaded thereon in a vertically staggered orientation. In alternate embodiments the substrates supported by the support sections may be horizontally staggered. The two robots 18, 22 are adapted to move their substrate end effectors in vertical directions to move in and out of the apertures 40, 42, 44 at different heights. The movable support 64 includes a top plate 72, a middle plate 74 and a bottom plate 76. The top plate 72 is located on the movable support 64 above the upper support section 66. The middle plate 74 is located between the upper support section 66 and the lower support section 68 of the movable support 64. The bottom plate 76 is located below the lower support section 68. The top plate 72 is sized and shaped to contact and make a seal with the upper surface seal 56 when the support 64 is in a down position. The bottom plate 76 is sized and shaped to contact and make a seal with the lower surface seal 62 when the support is in an up position (see FIG. 2). The middle plate 74 is sized and shaped to alternatively contact and form a seal with the lower surface seal 58 in the up position or with the upper surface seal 60 in the down position. Hence, when the movable support 64 is in the down position, the top plate 72 closes the upper passageway aperture 52 and the middle plate 74 closes the lower passageway aperture 54 isolating the middle chamber 36 from the upper chamber 34 and the lower chamber 38 (see FIG. 3A). When the movable support 64 is in the up position, shown in FIG. 2, the middle plate 74 closes the upper passageway aperture 52 and the lower plate 76 closes the lower aperture 54 again isolating the middle chamber 36 from the upper chamber 34 and lower chamber 38. Otherwise, when the support 64 is in an interim position, between the up and down positions, the middle chamber 36 communicates with the upper and lower chambers 34, 38 through the apertures 52, 54 (see FIG. 3B). In the preferred embodiment, the middle chamber 36 of the load lock 26 is connected to a source of vacuum 80 to evacuate the atmosphere in the chamber 36. The middle chamber also has an air inlet 82 to restore the atmosphere in the chamber 36 in a controlled manner. In alternate embodiments, the middle chamber of the load lock may be connected to a gas source to pressurize the chamber and a gas outlet to restore the chamber to atmospheric conditions in a controlled manner.

The drive motor 70 drives the movable support 64 of the load lock 26 upward to the up position shown in FIG. 2. With the movable support 64 in the up position, the upper support section 66 is located in the upper chamber 34 of the load lock 26. The atmospheric robot 22 can load and unload substrates through the top aperture 40 between the cassettes 24, 25 and the upper support section 66. The drive motor 70 maintains an upward force on the movable support 64 so that the middle plate 74 makes a sealing engagement with the lower seal 58 of the upper passageway aperture 52. The upward force exerted on the movable support 64 also drives the lower plate 76 to make a sealing engagement with the lower seal 62 of the lower passageway aperture 54. Thus, the middle chamber 36 is isolated from the upper and lower chambers 34, 38 and a vacuum environment may be introduced in the middle chamber 36. The air in the middle chamber 36 is evacuated by the vacuum source 80. In the embodiment shown, the seal 58 and middle plate 74 have been made smaller than the seal 62 and bottom plate 76. This has been done in order to harness atmospheric pressure as an aid in keeping the support 64 in the up position and keeping the middle chamber 36 sealed at the seals 58, 62 when the middle chamber 36 has a pressure less than atmospheric pressure. When the movable support 64 is in the up position and the middle chamber 36 has a pressure less than atmospheric pressure, the atmospheric pressure in the upper chamber 34 and bottom chamber 38 exerts a net upward force on the movable support 64. Atmospheric pressure in the bottom chamber 38 presses upward on the lower surface 77 of the bottom plate 76. Atmospheric pressure in the upper chamber 34 presses downward on the upper surface 73 of the middle plate 74. A net upward force on the movable support 64 is generated because the lower surface 77 of the bottom plate 76 has a larger area exposed to atmospheric pressure than the upper surface 73 of the middle plate 74. With the movable support 64 in the up position, the lower support section 68 is in the sealed middle chamber 34. After a vacuum is established in the middle chamber 34, the door 46 of aperture 42 may be opened without losing the integrity of the vacuum environment in the vacuum chamber 30. When the door 46 is open, the vacuum chamber robot 18 can remove and insert substrates on the lower support section 68 through the rear aperture 42 of the middle chamber 36. The door 46 is closed when the middle chamber 36 is pressurized in preparation for moving the support 64.

The drive motor 70 drives the movable support 64 downward relative to the frame 32, to the down position shown in FIG. 3A. In this position, the lower support section 68 is located in the bottom chamber 38 and the upper support section 66 is located in the middle chamber 36. The drive motor 70 maintains downward force on the support 64 so that the middle plate 74 makes sealing contact with the seal 60 and the top plate 72 makes sealing contact with the seal 56. Thus, the middle chamber 36 is again isolated from the upper and lower chambers 34, 38 and a vacuum may be introduced into the middle chamber 36. In addition, the top plate 72 is larger than the middle plate 74 to assist in sealing the middle chamber 36. When the movable support 64 is in the down position and the pressure in the middle chamber 36 is less than atmospheric pressure, the atmospheric pressure in the upper chamber 34 and the atmospheric pressure in the bottom chamber 38 act on the upper and middle plates 72, 74 respectively to exert a net downward force on the movable support 64. The top plate 72 is larger than middle plate 74. Also, the seal 56 around the upper passageway aperture 52 has a larger perimeter than the perimeter of seal 60 on the lower passageway aperture 54. Hence, when the upper plate 72 is seated on the upper seal 56 and the lower plate is seated on the lower seal 60, the upper plate 72 has a larger surface 71 wetted by the atmosphere in the upper chamber 34 than the surface 75 of the middle plate 74 wetted by the atmosphere in the bottom chamber 38. The atmosphere in the upper chamber 34 presses the wetted area of the upper plate 72 to create a downward force on the upper plate 72. The atmosphere in the bottom chamber 38 presses on the smaller wetted area of the middle plate 74 creating an upward force on the middle plate 74. Hence, the net force exerted on the main support 64 is downward because the downward force on the upper plate 72 is larger than the upward force on the middle plate 74. This helps to insure that the middle chamber 36 remains sealed so the door 46 can be opened. With the support 64 in the down position, the atmospheric robot 22 can insert and remove substrates S through the bottom aperture 44 from the bottom support section 68. The door 46 of the aperture 42 is opened after a vacuum is established in the middle chamber 36. When the door 46 is open, the vacuum chamber robot 18 can then insert and remove substrates S from the upper support section 66 through aperture 42. The door 46 is closed again prior to pressurizing the middle chamber 36 in preparation for returning the movable support 64 to its up position.

Referring also to FIG. 3B, the support 64 is shown at an intermediate position between the up position shown in FIG. 2 and the down position shown in FIG. 3A. When the support 64 moves up and down, the two passageway apertures 52, 54 in the dividers 48, 50 are not blocked. Thus, the three chambers 34, 36, 38 all have the same atmospheric pressure. The door 46 must be kept closed so as not to disturb the vacuum environment of the vacuum chamber 30. The computer controller 11 is programmed to prevent the atmospheric robot 22 from entering the apertures 40, 44, while the support 64 is being moved. This prevents damage to the movable support 64 and the atmospheric robot 22 resulting from a collision between them. The movable support 64 has appropriate sensors, such as limit switches, to signal the computer controller 11 when the movable support 64 is in the up or down positions or moving therebetween. An interlock prevents the computer controller 11 from moving the robot 22 unless the controller receives the signal that the support 64 is in the up or down positions. The computer controller 11 is programmed not to open the door 46 unless the middle chamber 36 is in a vacuum (the passageway apertures 52, 54 necessarily being blocked in order for this to occur). Preferably, the middle chamber has a pressure switch 86 to signal the computer controller 11 when a vacuum exists in the middle chamber 36. In addition, the computer controller 11 is programmed to not move the support 64 unless the door 46 is closed and the middle chamber 36 is at or very near atmospheric pressure. The pressure switch 86 signals the controller 11 when the middle chamber 36 is pressurized. Sensors on the movable support also signal the computer controller 11 when the support sections 66, 68 are empty or full with substrates.

The process for transporting substrates between the supply module 20 and the main section 12 is as follows. Initially, the movable support 64 of the load lock 26 may be in either its up position, shown in FIG. 2, or its down position, shown in FIG. 3A. The door 46 to the rear aperture 42 is closed and the middle chamber 36 is pressurized to atmospheric pressure. If the movable support 64 is down, the atmospheric robot 22 loads substrates from the cassettes 24, 26 into the lower support section 68 located in the bottom chamber 38 of the load lock 26. When the lower support section 68 is loaded with substrates, the computer controller 11 moves the movable support 64 to the up position (see FIG. 2). Then the lower support section 68 is moved from the bottom chamber 38 to the middle chamber 36, and the upper support section 66 is moved from the middle chamber 36 to the upper chamber 34 of the load lock 26. After the movable support 64 is in the up position, thereby sealing the middle chamber 36, the computer controller 11 evacuates the air from the middle chamber 36. The controller 11 opens the door 46 to the rear aperture 42 of the middle chamber 36 when the evacuation of the middle chamber 36 is completed. The vacuum chamber robot 18 then transports the substrates from the lower support section 68 in the middle chamber 36 to the main section 12 through the rear aperture 42. The vacuum chamber robot 18 may replace the unprocessed substrates removed from the lower support section 68 with previously processed substrates within the main section 12. In parallel with the evacuation of the middle chamber 36 and transporting of substrates between the vacuum chamber 30 and lower support section 68, the atmospheric robot 22 transports substrates from the supply module 16 to the upper support section 66 located in the upper chamber 34. After loading of the upper support section 66 and unloading (or reloading if appropriate) of the lower support section 68, the computer controller 11 closes the door 46. The middle chamber 36 is then pressurized to atmospheric pressure. When the pressure in the middle chamber 36 is substantially equal to atmospheric pressure, the computer controller 11 returns the movable support 64 to its down position (see FIG. 3A). The lower support section 68 is thus moved from the middle chamber 36 back to the bottom chamber 38, and the upper support section 66, loaded with unprocessed substrates, is moved from the upper chamber 34 to the middle chamber 36. Again, the air in the middle chamber 34 is evacuated and then the door 46 is opened. The vacuum chamber robot 18 commences transport of substrates from the upper support section 66 to the vacuum chamber 30. Any previously processed substrates are returned from the vacuum chamber 30 to the upper support section 66. Concurrent with the depressurization of the middle chamber 36 and removal or replacement of substrates from the upper support section 66, the atmospheric robot 22 removes any processed substrates on the lower support section 68 and replaces them with unprocessed substrates from the supply module 16. Upon completion of unloading and reloading of the upper support section 66 and the lower support section 68, the door 46 is closed and the middle chamber 36 is pressurized to atmospheric pressure. The movable support 64 is then moved back to the up position. The above cycle is repeated as necessary until the transport of substrates between the supply module 16 and main section 12 is completed. The present invention allows the atmospheric robot 22 to load or unload one set of substrates at either the top or bottom chambers while, at the same time, a second set of substrates is in the middle chamber during evacuation or pressurization of the middle chamber or being moved by the vacuum chamber robot. Thus, the single load lock 26 of the present invention can perform almost as fast and with the same throughput as two conventional load locks.

As is known in the art, evacuation of a load lock chamber needs to be done relatively slowly, such as about two minutes. This is because, if evacuated too fast, water vapor in the air will condense into water droplets on the substrates. Also as is known in the art, returning a load lock to atmospheric pressure needs to be done relatively slowly to prevent the air from moving the substrates. The load lock chambers are preferably not large because of the problems encountered with evacuation and time. Thus, a load lock for relatively large substrates, such as wafers having a 300 mm diameter or more, because of time constraints, will only be able to hold a small batch of substrates due to size constraints of the evacuation chamber. The present invention allows both of the robots 18, 22 to operate at or very close to peak duty cycle without increasing the footprint of the apparatus 10, without having to add additional conventional load locks, without having to run the atmospheric robot 22 at an excessive speed, and without speeding up or changing the small batch evacuation procedures of the load lock. In addition, the motor 70 does not need to be an expensive indexer motor. The motor 70 need only be a less expensive two position motor. Because the middle chamber 36 is relatively small, a compact vacuum pump can be used. The present invention overcomes the problem of the prior art atmospheric robot down time and potentially excessive catch-up speed. The atmospheric robot 22 can now operate at a slower safer speed without slowing down the operation of the vacuum chamber robot 18. The ability of the atmospheric robot 22 to have almost continuous access to either the upper section 66 or the lower support section 68 without changing the general evacuation and pressurizing scheme of the load lock can also allow higher substrate throughput to occur. The present invention could be used for larger batches of substrates and smaller size substrates. Doors could be used at the front apertures 40, 44, such as if all three chambers were normally maintained in a vacuum except when either the top or bottom chamber was being used with the atmospheric robot 22. A load lock with more than three chambers and/or more than two substrate support sections could be used. Rather than merely vertical movement, the substrate support could move in other paths or directions. The load lock could also be used in any suitable type of substrate processing apparatus.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate load lock comprising:
   a frame forming at least three chambers; and
   a substrate support movably mounted to the frame to move relative to the frame from an initial position to a final position, the substrate support having at least two separate support areas, a first one of the support areas being movable between a first one of the chambers and a second one of the chambers, and a second one of the support areas being movable between the second chamber and a third one of the chambers, the two support areas being disposed on the substrate support in spaced relation, wherein the first support area and the second support area are respectively located in different ones of the three chambers when the support is in the final position.

2. A substrate load lock as in claim 1, wherein the Second chamber has an upper opening communicating with the first chamber, the opening being adapted to admit the first support area therethrough.

3. A substrate load lock as in claim 1, wherein the second chamber has a lower opening communicating with the third chamber, the opening being adapted to admit the second support area therethrough.

4. A substrate load lock as in claim 1, wherein the second chamber has a first hole communicating with the first chamber and a second hole communicating with the third chamber and wherein the substrate support extends through the second chamber within the first hole and the second hole.

5. A substrate load lock as in claim 1, wherein the substrate support comprises means for sealing the second chamber from the first chamber and the third chamber.

6. A substrate load lock as in claim 5, wherein the means for sealing the second chamber comprise the substrate support having three seal members thereon located so that the first support area is between a first one of the seal members and a second one of the seal members, and the second support area is between the second seal member and a third one of the seal members.

7. A substrate load lock as in claim 6, wherein the first seal member and the second seal member seal the second chamber when the first support area is in the second chamber, and the second seal member and the third seal member seal the second chamber when the second support area is in the second chamber.

8. A substrate load lock as in claim 1, wherein the second chamber has a closable aperture adapted to allow a substrate to pass therethrough when the substrate is being transported between the load lock and a substrate processing device.

9. A substrate load lock as in claim 1, wherein the first chamber has a first substrate transport aperture through which substrates are transported between a supply module and the first support area when the first support area is in the first chamber, and wherein the third chamber has a second substrate transport aperture discrete from the first substrate transport aperture, the second substrate transport aperture allowing substrates to be transported between the supply module and the second support area when the second support area is in the third chamber.

10. A substrate load lock as in claim 1, wherein the first support area and the second support area each have a plurality of supports so that each support area may support a plurality of substrates.

11. A substrate load lock comprising:
    a frame forming at least one sealable chamber;
    means for varying the environment of the chamber; and
    at least two substrate supports movably connected to the frame so that each substrate support is alternately movable into the sealable chamber;
    the two substrate supports being connected to each other wherein movement of one substrate support effects movement of the other substrate support, and wherein, when the sealable chamber is sealed, only one of the substrate supports is located therein.

12. A substrate load lock as in claim 11, wherein the two substrate supports are moved by a common actuator mounted to the frame.

13. A substrate load lock as in claim 12, wherein the actuator has a reciprocating member within the frame, the two substrate supports being connected to the reciprocating member so that the two substrate supports reciprocate in phase with the reciprocating member in a direction substantially parallel to a stroke of the reciprocating member.

14. A substrate load lock as in claim 12, wherein the actuator is a poppet moving a first one of the substrate supports between an upper chamber of the load lock and the sealable chamber, and moving a second one of the substrate supports between a lower chamber of the load lock and the sealable chamber.

15. A substrate load lock as in claim 12, wherein the sealable chamber has an upper aperture communicating with an upper chamber of the load lock and a lower aperture communicating with a lower chamber of the load lock.

16. A substrate load lock as in claim 15, wherein the actuator has a reciprocating member within the frame, the reciprocating member having seal plates thereon to seal the upper aperture and lower aperture of the sealable chamber when each of the two substrate supports is located therein.

17. A substrate load lock as in claim 16, wherein the reciprocating member has three of the seal plates, an upper one of the seal plates being adapted to engage an upper seal of the upper aperture to close the upper aperture, a bottom one of the seal plates being adapted to engage a lower seal of the lower aperture to close the lower aperture and a middle one of the seal plates being adapted to engage a lower seal of the upper aperture to close the upper aperture and being adapted to alternatively engage an upper seal of the lower aperture to close the lower aperture.

18. A substrate load lock as in claim 17, wherein the middle seal plate closes the upper aperture when the bottom seal plate closes the lower aperture and wherein the middle seal plate closes the lower aperture when the upper seal plate closes the upper aperture.

19. A substrate load lock as in claim 18, wherein the upper seal plate has an upper surface subjected to atmospheric pressure and the middle seal plate has a lower surface subjected to atmospheric pressure, the upper surface of the upper seal plate being larger than and facing substantially opposite to the lower surface of the middle seal plate so that atmospheric pressure urges the upper seal plate against the upper seal of the upper aperture and the middle seal plate against the upper seal of the lower aperture when the sealable chamber has a vacuum therein.

20. A substrate load lock as in claim 18, wherein the bottom seal plate has a lower surface subjected to atmospheric pressure, and the middle plate has an upper surface subjected to atmospheric pressure, the lower surface of the bottom seal plate being larger than and facing substantially opposite to the upper surface of the middle seal plate so that atmospheric pressure urges the bottom seal plate against the lower seal of the lower aperture and the middle seal plate against the lower seal of the upper aperture when the sealable chamber has a vacuum therein.

21. A substrate load lock comprising:
a frame having a chamber formed therein, the chamber having an upper substrate receiving opening and lower substrate receiving opening; and
a moving support attached to the frame, the moving support having an upper substrate support area and a lower substrate support area, wherein the moving support reciprocates for alternately moving the upper support area and the lower support area into the chamber, the upper support area being moved through the upper substrate receiving opening and the lower support area being moved through the lower substrate receiving opening.

22. A substrate load lock as in claim 21, wherein the moving support has seals to close the upper substrate receiving opening and the lower substrates receiving opening so that the chamber is isolated from an upper plenum of the load lock and a lower plenum of the load lock.

23. A substrate load lock as in claim 21, wherein the moving support has an upper one of the seals, a middle one of the seals and a lower one of the seals, the upper substrate support area being located between the upper seal and middle seal and the lower substrate support area being located between the middle seal and the lower seal.

24. A substrate load lock as in claim 23, wherein the upper seal and middle seal respectively close the upper substrate receiving opening and the lower substrate receiving opening when the moving support moves the upper substrate support area into the chamber, and wherein the middle seal and lower seal respectively close the upper substrate receiving opening and lower substrate receiving opening when the moving support moves the lower substrate support area into the chamber.

25. A substrate load lock as in claim 21, wherein the chamber has a substrate transport slot in a side of the chamber so that the chamber communicates with a processing chamber of a substrate processing device, the slot having a gate to isolate the chamber from the processing chamber in the processing device when the upper substrate receiving opening and the lower substrate receiving opening of the chamber are open.

26. A method for transporting a substrate between a substrate processing device and a supply module comprising the steps of:
transporting the substrate between a movable first substrate support area in a load lock and the supply module, the first substrate support area being located in an initial position wherein a first substrate transport mechanism for transporting substrates between the supply module and load lock has access to the first substrate support area;
moving the first substrate support area within the load lock from an initial position to a final position, wherein in the final position a second substrate transport mechanism has access to the first substrate support area; and
transporting the substrate with the second substrate transport mechanism between the first substrate support area in the load lock and the substrate processing device;
wherein moving the first substrate support area effects movement of a second substrate support area of the load lock.

27. A method for transporting a substrate as in claim 26, wherein the second substrate support area of the load lock is moved within the load lock from an initial position to a final position when moving the first substrate support area, the first substrate transport mechanism having access to the second substrate support area when the second substrate support area is in its final position.

28. A method for transporting a substrate as in claim 27, further comprising the step of providing the load lock with the first substrate support area and the second substrate support area being connected to a common support movably mounted to the load lock.

29. A method for transporting a substrate as in claim 26, wherein the step of transporting the substrate between the first substrate support area in the load lock and the substrate processing device comprises changing the environment within a first part of the load lock having the substrate support area therein while maintaining the environment of a second part of the load lock unchanged.

30. A substrate load lock comprising:
a frame forming at least three chambers; and
a substrate support movably mounted to the frame, the substrate support having at least two separate support areas, a first one of the support areas being movable between a first one of the chambers and a second one of the chambers, and a second one of the support areas being movable between the second chamber and a third one of the chambers;
wherein the substrate support has three seal members thereon located so that the first seal member and the second seal member seal the second chamber when the first support area is in the second chamber, and the second seal member and the third seal member seal the second chamber when the second support area is in the second chamber.

31. A substrate load lock comprising:
a frame forming at least one sealable chamber;
means for varying the environment of the chamber; and
at least two substrate supports movably connected to the frame so that each substrate support is alternately movable into the sealable chamber;
wherein, the two substrate supports are moved by a common actuator mounted to the frame, and wherein, when the sealable chamber is sealed, only one of the substrate supports is located therein.

* * * * *